(12) United States Patent
Gunnam

(10) Patent No.: US 8,316,272 B2
(45) Date of Patent: Nov. 20, 2012

(54) ERROR-CORRECTION DECODER EMPLOYING MULTIPLE CHECK-NODE ALGORITHMS

(75) Inventor: Kiran Gunnam, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 274 days.

(21) Appl. No.: 12/680,810

(22) PCT Filed: Apr. 8, 2009

(86) PCT No.: PCT/US2009/039918
§ 371 (c)(1),
(2), (4) Date: Mar. 30, 2010

(87) PCT Pub. No.: WO2010/019287
PCT Pub. Date: Feb. 18, 2010

(65) Prior Publication Data
US 2010/0241921 A1    Sep. 23, 2010

Related U.S. Application Data

(60) Provisional application No. 61/089,297, filed on Aug. 15, 2008.

(51) Int. Cl.
*H03M 13/00* (2006.01)
(52) U.S. Cl. ............... 714/752; 714/786; 714/799
(58) Field of Classification Search ............... 714/752, 714/786, 799
See application file for complete search history.

(56) References Cited

U.S. PATENT DOCUMENTS

| | | | |
|---|---|---|---|
| 3,755,779 | A | 8/1973 | Price |
| 4,295,218 | A | 10/1981 | Tanner |
| 5,048,060 | A | 9/1991 | Arai et al. |
| 6,307,901 | B1 | 10/2001 | Yu et al. |
| 6,550,023 | B1 | 4/2003 | Brauch et al. |
| 6,888,897 | B1 | 5/2005 | Nazari et al. |

(Continued)

FOREIGN PATENT DOCUMENTS
WO    WO03092170 A1    11/2003
(Continued)

OTHER PUBLICATIONS

Sripimanwat, K., "Turbo Code Applications: A Journey From a Paper to Realization", Oct. 26, 2005, Springer, p. 27.

(Continued)

*Primary Examiner* — Esaw Abraham
(74) *Attorney, Agent, or Firm* — Mendelsohn, Drucker & Associates, P.C.; Craig M. Brown; Steve Mendelsohn

(57) ABSTRACT

In one embodiment, an LDPC decoder has a controller and one or more check-node units (CNUs). The CNUs generate check-node messages using a scaled min-sum algorithm, an offset min-sum algorithm, or a scaled and offset min-sum algorithm. Initially, the controller selects a scaling factor and an offset value. The scaling factor may be set to one for no scaling, and the offset value may be set to zero for no offsetting. If the decoder is unable to correctly decode a codeword, then (i) the controller selects a new scaling and/or offset value and (ii) the decoder attempts to correctly decode the codeword using the new scaling and/or offset value. By changing the scaling factor and/or offset value, LDPC decoders of the present invention may be capable of improving error-floor characteristics over LDPC decoders that use only fixed or no scaling factors or fixed or no offsetting factors.

20 Claims, 3 Drawing Sheets

U.S. PATENT DOCUMENTS

| | | | |
|---|---|---|---|
| 7,181,676 | B2 | 2/2007 | Hocevar |
| 7,237,181 | B2 | 6/2007 | Richardson |
| 7,296,216 | B2 | 11/2007 | Shen et al. |
| 7,340,671 | B2 * | 3/2008 | Jones et al. ............... 714/800 |
| 7,353,444 | B2 | 4/2008 | Owsley et al. |
| 7,457,367 | B2 | 11/2008 | Farhang-Boroujeny et al. |
| 7,689,888 | B2 | 3/2010 | Kan et al. |
| 7,725,800 | B2 | 5/2010 | Yang et al. |
| 7,739,558 | B1 | 6/2010 | Farjadrad et al. |
| 7,752,523 | B1 | 7/2010 | Chaichanavong et al. |
| 7,805,642 | B1 | 9/2010 | Farjadrad |
| 7,895,500 | B2 * | 2/2011 | Sun et al. ............... 714/758 |
| 7,904,793 | B2 | 3/2011 | Mokhlesi et al. |
| 7,941,737 | B2 * | 5/2011 | Gopalakrishnan et al. ... 714/804 |
| 7,949,927 | B2 | 5/2011 | Park et al. |
| 8,010,869 | B2 | 8/2011 | Wejn et al. |
| 8,020,070 | B2 | 9/2011 | Langner et al. |
| 8,037,394 | B2 | 10/2011 | Djurdjevic et al. |
| 8,046,658 | B2 | 10/2011 | Heinrich et al. |
| 8,051,363 | B1 | 11/2011 | Liu |
| 8,103,931 | B2 | 1/2012 | Wang et al. |
| 8,127,209 | B1 | 2/2012 | Zhang et al. |
| 8,151,171 | B2 * | 4/2012 | Blanksby ............... 714/780 |
| 8,156,409 | B2 * | 4/2012 | Patapoutian et al. ......... 714/780 |
| 8,616,345 | | 4/2012 | Graef |
| 8,171,367 | B2 | 5/2012 | Gao et al. |
| 8,205,134 | B2 | 6/2012 | Harrison et al. |
| 8,205,144 | B1 | 6/2012 | Yadav |
| 8,219,878 | B1 | 7/2012 | Varnica et al. |
| 8,255,763 | B1 | 8/2012 | Yang et al. |
| 2002/0062468 | A1 | 5/2002 | Nagase et al. |
| 2002/0166095 | A1 | 11/2002 | Lavi et al. |
| 2005/0132260 | A1 | 6/2005 | Kyung et al. |
| 2005/0193320 | A1 | 9/2005 | Varnica et al. |
| 2005/0204255 | A1 | 9/2005 | Yeh et al. |
| 2005/0283707 | A1 | 12/2005 | Sharon et al. |
| 2006/0107181 | A1 | 5/2006 | Dave et al. |
| 2006/0285852 | A1 | 12/2006 | Xi et al. |
| 2007/0011569 | A1 | 1/2007 | Vila Casado et al. |
| 2007/0011573 | A1 | 1/2007 | Farjadrad et al. |
| 2007/0011586 | A1 | 1/2007 | Belogolovyi et al. |
| 2007/0044006 | A1 | 2/2007 | Yang et al. |
| 2007/0071009 | A1 | 3/2007 | Nagaraj et al. |
| 2007/0089018 | A1 | 4/2007 | Tang et al. |
| 2007/0089019 | A1 | 4/2007 | Tang et al. |
| 2007/0124652 | A1 | 5/2007 | Litsyn et al. |
| 2007/0147481 | A1 | 6/2007 | Bottomley et al. |
| 2007/0153943 | A1 | 7/2007 | Nissila |
| 2007/0162788 | A1 | 7/2007 | Moelker |
| 2007/0220408 | A1 | 9/2007 | Huggett et al. |
| 2007/0234178 | A1 | 10/2007 | Richardson et al. |
| 2007/0234184 | A1 | 10/2007 | Richardson |
| 2008/0049869 | A1 | 2/2008 | Heinrich et al. |
| 2008/0082868 | A1 | 4/2008 | Tran et al. |
| 2008/0104485 | A1 | 5/2008 | Yurievich Lyakh et al. |
| 2008/0109701 | A1 | 5/2008 | Yu et al. |
| 2008/0126910 | A1 | 5/2008 | Venkatesan et al. |
| 2008/0148129 | A1 | 6/2008 | Moon et al. |
| 2008/0163032 | A1 | 7/2008 | Lastras-Montano |
| 2008/0235561 | A1 | 9/2008 | Yang |
| 2008/0276156 | A1 | 11/2008 | Gunnam et al. |
| 2008/0301517 | A1 | 12/2008 | Zhong |
| 2008/0301521 | A1 | 12/2008 | Gunnam et al. |
| 2009/0063931 | A1 | 3/2009 | Rovini et al. |
| 2009/0083609 | A1 | 3/2009 | Yue et al. |
| 2009/0132897 | A1 | 5/2009 | Xu et al. |
| 2009/0150745 | A1 | 6/2009 | Langner et al. |
| 2009/0235146 | A1 | 9/2009 | Tan et al. |
| 2009/0259912 | A1 | 10/2009 | Djordjevic et al. |
| 2009/0273492 | A1 | 11/2009 | Yang et al. |
| 2009/0307566 | A1 | 12/2009 | No et al. |
| 2009/0319860 | A1 | 12/2009 | Sharon et al. |
| 2010/0037121 | A1 | 2/2010 | Jin et al. |
| 2010/0042806 | A1 | 2/2010 | Gunnam |
| 2010/0042890 | A1 | 2/2010 | Gunnam |
| 2010/0050043 | A1 | 2/2010 | Savin |
| 2010/0058152 | A1 | 3/2010 | Harada |
| 2010/0088575 | A1 | 4/2010 | Sharon et al. |

FOREIGN PATENT DOCUMENTS

| | | |
|---|---|---|
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001, pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005, pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963, p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002. pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

* cited by examiner $$H = \begin{bmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{bmatrix} \begin{matrix} \Big\} r=4 \end{matrix}$$

ERROR-CORRECTION DECODER EMPLOYING MULTIPLE CHECK-NODE ALGORITHMS

CROSS-REFERENCE TO RELATED APPLICATIONS

This application claims the benefit of the filing date of U.S. provisional application No. 61/089,297, filed on Aug. 15, 2008, the teachings all of which are incorporated herein by reference in their entirety.

The subject matter of this application is related to U.S. patent application Ser. No. 12/113,729 filed May 1, 2008, U.S. patent application Ser. No. 12/113,755 filed May 1, 2008, U.S. patent application Ser. No. 12/323,626 filed Nov. 26, 2008, U.S. patent application Ser. No. 12/401,116 filed Mar. 10, 2009, PCT patent application no. PCT/US08/86523 filed Dec. 12, 2008, and PCT patent application no. PCT/US08/86537 filed Dec. 12, 2008, the teachings all of which are incorporated herein by reference in their entirety.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In decoding a codeword, a low-density parity-check (LDPC) decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to break dominant trapping sets (i.e., trapping sets typically having the most-significant influence on error-floor characteristics). These dominant trapping sets vary widely based on the operating conditions of the decoder, such as decoder alphabet, decoder algorithm, decoder check-node unit update, channel conditions, and signal conditions.

SUMMARY OF THE INVENTION

In one embodiment, the present invention is a method for decoding an error-correction (EC) encoded codeword to recover a correct codeword. The method selects a scaling factor and an offset value, and receives an initial set of initial values from an upstream processor. The initial set of initial values corresponds to the EC-encoded codeword, and each initial value in the initial set corresponds to a different bit of the EC-encoded codeword. A first set of messages is generated based on the initial set of initial values, and the first set of messages is converted into scaled-and-offset messages based on the scaling factor and the offset value.

In another embodiment, the present invention is an apparatus for performing the method described above. The apparatus comprises an error-correction (EC) decoder for decoding the EC-encoded codeword to recover a correct codeword. The decoder generates the first set of messages and comprises (i) one or more blocks adapted to convert the first set of messages into scaled-and-offset messages based on a scaling factor and an offset value and (ii) a controller adapted to select the scaling factor and the offset value.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check H-matrix that may be used to implement a regular, quasi-cyclic (QC) low-density parity-check (LDPC) code;

DETAILED DESCRIPTION

Figure 2:
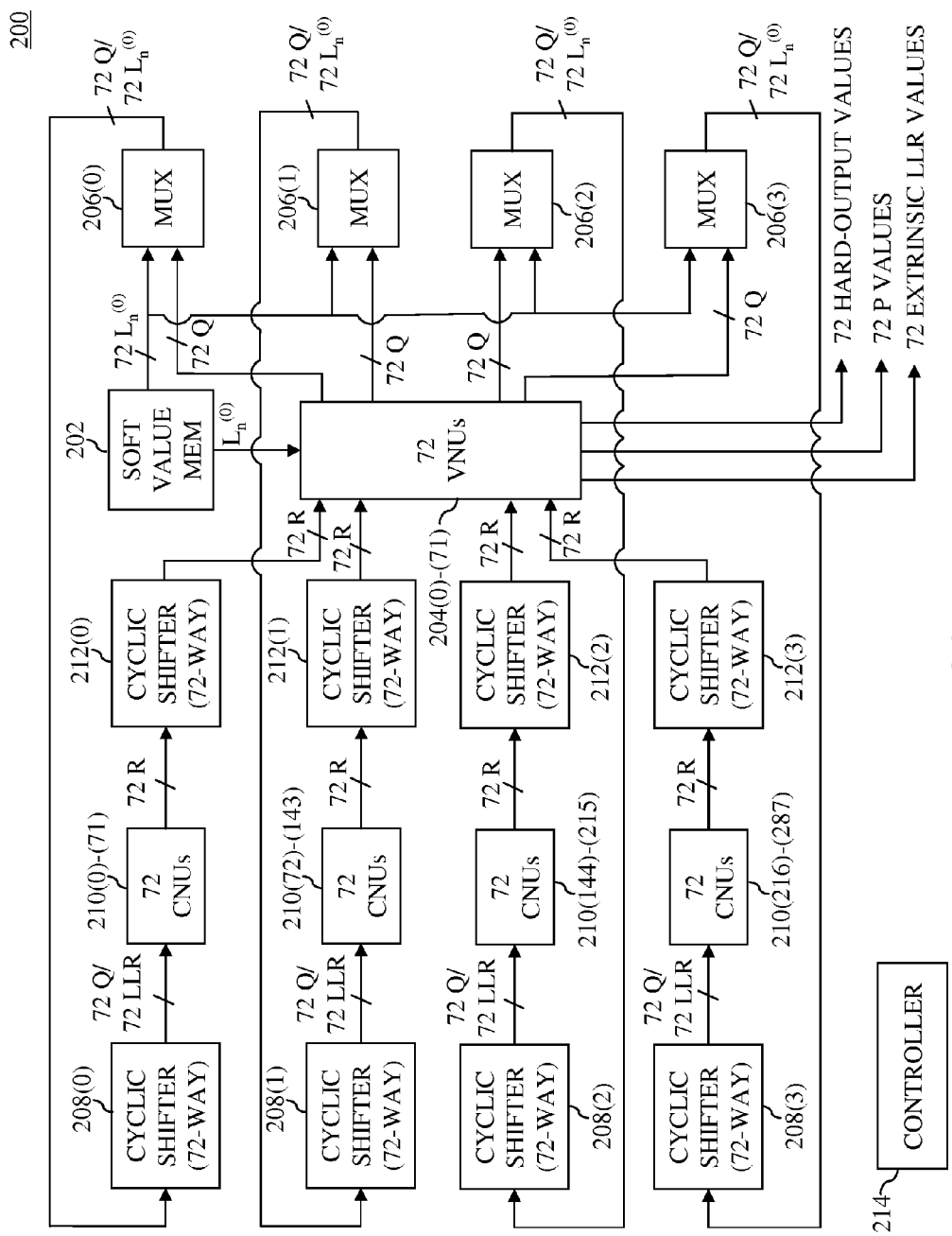
FIG. 2 shows a simplified block diagram of an LDPC decoder according to one embodiment of the present invention that may be used to decode a signal encoded using an H-matrix such as the H-matrix of FIG. 1.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Error-floor characteristics of an LDPC decoder may be improved by changing the check-node algorithm employed by the LDPC decoder. Typically, trapping sets that result from using a particular check-node algorithm are different from those that result from using other check-node algorithms. Thus, different trapping sets may be obtained, for example, by changing the check-node algorithm from an offset min-sum algorithm to a scaled min-sum algorithm. Different trapping sets may also be obtained by changing the offset value employed by an offset min-sum algorithm, or by changing the scaling factor employed by a scaled min-sum algorithm.

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants (i.e., block rows) where j=1, . . . , r and c=10 columns of circulants (i.e., block columns) where k=1, . . . , c. A circulant is a sub-matrix that is either an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by cyclically shifting a single p×p identity matrix. For purposes of this discussion, assume that p=72 such that H-matrix 100 has p×r=72×4=288 total rows and p×c=72×10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to an $m^{th}$ check node, where m ranges from 0, . . . , 287, and each of the 720 columns corresponds to an $n^{th}$ variable node (also referred to as a bit node), where n ranges from 0, ..., 719. Further, each check node is connected to $w_r=10$ variable nodes as indicated by the 1s in a row, and each variable node is connected to $w_c=4$ check nodes as indicated by the is in a column. H-matrix 100 may be described as a regular LDPC code since all rows of H-matrix 100 have the same hamming weight $w_r$ and all columns of H-matrix 100 have the same hamming weight $w_c$.

FIG. 2 shows a simplified block diagram of an LDPC decoder 200 according to one embodiment of the present invention that may be used to decode codewords encoded using an H-matrix such as H-matrix 100 of FIG. 1. For each codeword received, LDPC decoder 200 (i) receives 720 soft values (e.g., log-likelihood ratios (LLR)) $L_n^{(0)}$ from an upstream processor that may perform, for example, radio-frequency processing, analog-to-digital conversion, equalization, channel detection such as Viterbi detection, or other processing suitable for generating soft-output values, and (ii) stores these soft values) $L_n^{(0)}$ in soft-value memory 202. The processing performed by the upstream processor may depend on the particular application in which LDPC decoder 200 is implemented. Each soft value $L_n^{(0)}$ corresponds to one bit of the codeword, and each codeword is decoded iteratively using a message-passing algorithm. For this discussion, suppose that each soft value $L_n^{(0)}$ has five bits, including one hard-decision bit and a four-bit confidence value.

In general, LDPC decoder 200 decodes the 720 soft values $L_n^{(0)}$ (i.e., messages) using a block-serial message-passing schedule. The messages are updated using (i) 288 check-node units (CNUs) 210, where each CNU 210 performs check-node updates for one row (i.e., the $m^{th}$ check node) of H-matrix 100 and (ii) 72 five-bit variable-node units (VNUs) 204, where each VNU 204 performs the variable-node updates for ten columns (i.e., the $n^{th}$ variable nodes) of H-matrix 100. CNUs 210(0), ..., 210(287) perform the check-node (i.e., row) updates for the 288 rows of H-matrix 100, one block column at a time, such that the check-node updates for the first block column (i.e., circulants $B_{1,1}$, $B_{2,1}$, $B_{3,1}$, and $B_{4,1}$) are performed, followed by the check-node updates for the second block column (i.e., circulants $B_{1,2}$, $B_{2,2}$, $B_{3,2}$, and $B_{4,2}$), followed by the check-node updates for the third block column (i.e., circulants $B_{1,3}$, $B_{2,3}$, $B_{3,3}$, and $B_{4,3}$), and so forth. VNUs 204(0), ..., 204(71) then perform the variable-node (i.e., column) updates for the 720 columns of H-matrix 100, one block column at a time, such that the variable-node updates for the first block column (i.e., circulants $B_{1,1}$, $B_{2,1}$, $B_{3,1}$, and $B_{4,1}$) are performed, followed by the variable-node updates for the second block column (i.e., circulants $B_{1,2}$, $B_{2,2}$, $B_{3,2}$, and $B_{4,2}$), followed by the variable-node updates for the third block column (i.e., circulants $B_{1,3}$, $B_{2,3}$, $B_{3,3}$, and $B_{4,3}$), and so forth. An iteration of LDPC decoder 200 (i.e., a local iteration) is complete after all check-node updates and variable-node updates have been performed.

Initially, the 720 five-bit soft values $L_n^{(0)}$ are provided to four multiplexers 206(0), ..., 206(3) at a rate of 72 soft values $L_n^{(0)}$ per clock cycle such that each multiplexer 206 receives all 72 soft values $L_n^{(0)}$ in the set. Each multiplexer 206 also receives 72 five-bit variable-node messages (herein referred to as Q messages) from VNUs 204(0), ..., 204(71), which are generated as discussed in further detail below. During the first iteration of LDPC decoder 200, multiplexers 206(0), ..., 206(3) select the sets of 72 five-bit soft values $L_n^{(0)}$ that they receive to output to 72-way cyclic shifters 208(0), ..., 208(3), respectively. The initial Q messages, which are not selected, may be Q messages generated for a previously considered codeword. During subsequent iterations of LDPC decoder 200, multiplexers 206(0), ..., 206(3) select the sets of 72 five-bit Q messages that they receive from VNUs 204(0), ..., 204(71) to output to 72-way cyclic shifters 208(0), ..., 208(3), respectively. For the following discussion, it will be understood that any reference to Q messages, applies to soft values $L_n^{(0)}$ during the first iteration of LDPC decoder 200.

Cyclic shifters 208(0), ..., 208(3) cyclically shift the sets of 72 five-bit Q messages that they receive based on a cyclic-shift signal that may be received from, for example, controller 214. The cyclic-shift signal corresponds to cyclic-shift factors of the circulants of H-matrix 100 of FIG. 1. For example, during the first clock cycle of an iteration of LDPC decoder 200, cyclic shifters 208(0), ..., 208(3) may shift their respective sets of 72 five-bit Q messages based on the shift factors of circulants $B_{1,1}$, $B_{2,1}$, $B_{3,1}$, and $B_{4,1}$ of H-matrix 100 of FIG. 1, respectively. During the second clock cycle of an iteration of LDPC decoder 200, cyclic shifters 208(0), ..., 208(3) shift their respective sets of 72 five-bit Q messages based on the shift factors of circulants $B_{1,2}$, $B_{2,2}$, $B_{3,2}$, and $B_{4,2}$, respectively. Cyclic shifters 208(0), ..., 208(3) then provide their respective 72 cyclically shifted five-bit Q messages to CNUs 210(0), ..., 210(287), such that each CNU 210 receives a different one of the Q messages.

Each CNU 210 (i) receives a number of five-bit Q messages equal to the hamming weight $w_r$ of a row of H-matrix 100 (e.g., 10) at a rate of one Q message per clock cycle and (ii) generates $w_r$ five-bit check-node messages (herein referred to as R messages). Each CNU 210 is selectively configurable to generate R messages using (i) an offset min-sum check-node algorithm, (ii) a scaled min-sum check-node algorithm, or (iii) a min-sum check-node algorithm that applies both offsetting and scaling. Each R message may be represented as shown in Equations (1), (2), and (3) shown below:

$$R_{mn}^{(i)} = \delta_{mn}^{(i)} \max(\alpha \kappa_{mn}^{(i)} - \beta, 0) \tag{1}$$

$$\kappa_{mn}^{(i)} = |R_{mn}^{(i)}| = \min_{n' \in N(m)/n} |Q_{n'm}^{(i-1)}| \tag{2}$$

$$\delta_{mn}^{(i)} = \left( \prod_{n' \in N(m)/n} \text{sign}(Q_{n'm}^{(i-1)}) \right), \tag{3}$$

where (i) $R_{mn}^{(i)}$ represents the R message corresponding to $m^{th}$ check node (i.e., row) and the $n^{th}$ variable node (i.e., column) of H-matrix 100 of FIG. 1 for the $i^{th}$ iteration of LDPC decoder 200, (ii) $Q_{mn}^{(i-1)}$ represents the Q message corresponding to the $n^{th}$ variable node and the $m^{th}$ check node of H-matrix 100 for the $(i-1)^{th}$ iteration, (iii) $\alpha$ represents a scaling factor, which ranges from 0 to 1, (iv) $\beta$ represents an offset value, which ranges from 0 to 15, and (v) the function sign indicates that the multiplication operation (i.e., $\Pi$) is performed on the signs of the $Q_{min}^{(i-1)}$ messages. Suppose that n' is a variable node in the set N(m)/n of all variable nodes connected to the $m^{th}$ check node except for the $n^{th}$ variable node (i.e., n'∈N(m)/n). The CNU 210 corresponding to the $m^{th}$ check node (i.e., row) generates message $R_{mn}^{(i)}$ based on all Q messages received during the previous $(i-1)^{th}$ iteration from the set N(m)/n. Thus, in the embodiment of FIG. 2, each R message is generated based on N(m)/n=nine Q messages (i.e., $w_r-1=10-1$). Note that, for the first iteration, soft values $L_n^{(0)}$ received from soft-value memory 202 are used in Equations (2) and (3) in lieu of the Q messages for the prior iteration (i.e., $Q_{n'm}^{(0)}=L_{n'm}^{(0)}$).

The particular algorithm used by each CNU 210 may be selected, for example, by controller 214. For example, to implement an offset min-sum check-node algorithm without scaling, controller 214 may select a scaling factor $\alpha$ of 1, such that CNU 210 performs no scaling, and an offset value β other than 0. To implement a scaled min-sum check-node algorithm without offsetting, controller 214 may select an offset value β of 0, such that CNU 210 performs no offsetting, and a scaling factor α of other than 1. To implement a min-sum check-node algorithm that performs both scaling and offsetting, controller 214 may select an offset value β other than 0 and a scaling factor α of other than 1. Initially, controller 214 selects a desired offset and scaling factor. Controller 214 may then vary the offset and scaling factor, for example, from one iteration of LDPC decoder 200 (i.e., one local iteration) to the next, from one layer of the LDPC code to the next, from one codeword to the next, and from one global iteration (described further below) to the next.

Figure 3:
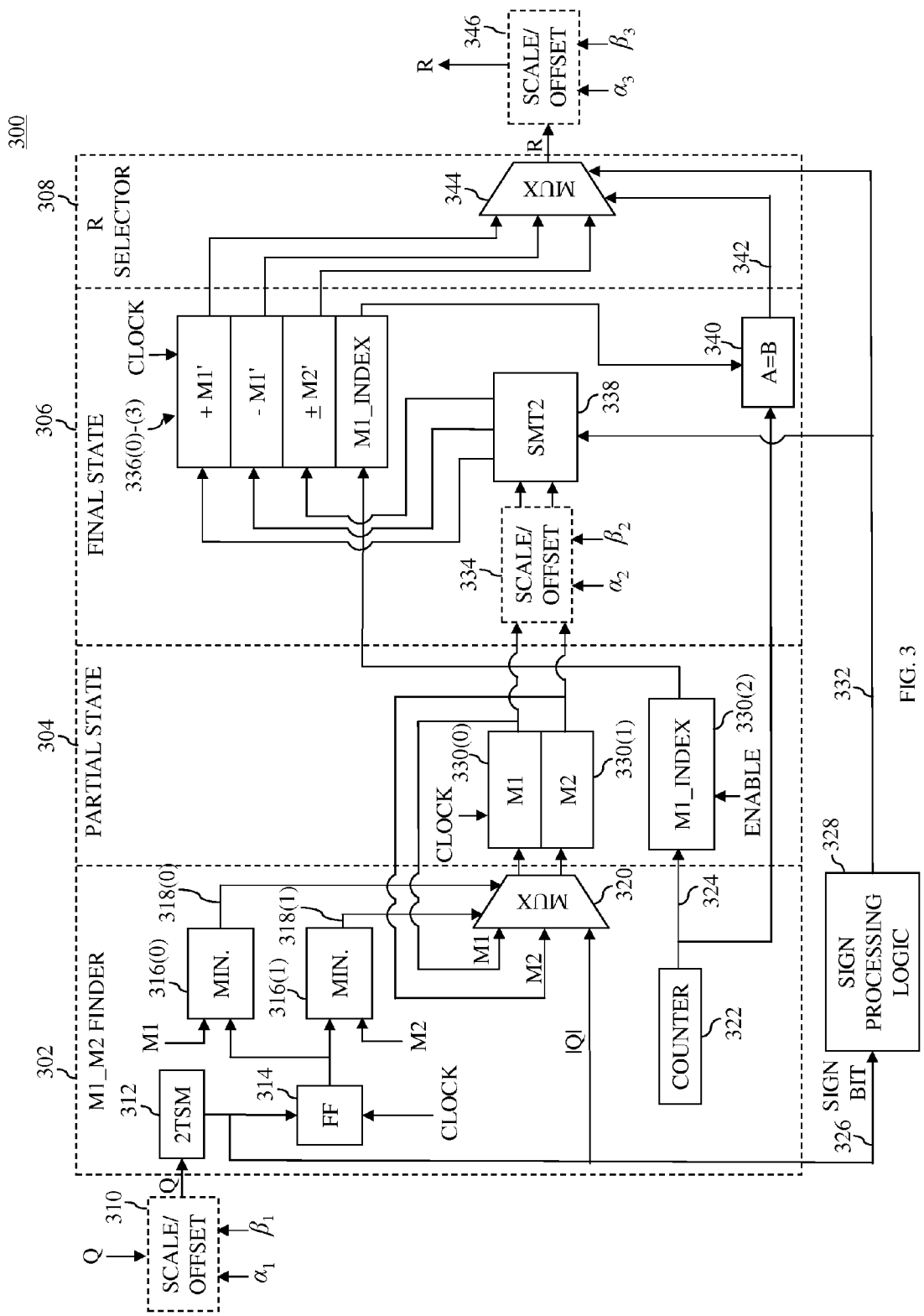
FIG. 3 shows a simplified block diagram of one implementation of a check-node unit (CNU) that may be used to implement each CNU of the LDPC decoder of FIG. 2.

FIG. 3 shows a simplified block diagram of a CNU 300 according to one embodiment of the present invention that may be used to implement each CNU 210 of LDPC decoder 200 of FIG. 2. In general, CNU 300 generates ten five-bit R messages, where each five-bit R message is generated using a set of N(m)/n=nine Q messages (one message is excluded as described above). For nine of these ten five-bit R messages, the minimum magnitude of the Q messages generated using Equation (2) is the same. For one of these R messages, the minimum magnitude of the Q messages will be the second-smallest magnitude of the Q messages because the minimum magnitude of the Q messages will be excluded from the calculation as described above. Rather than performing Equation (2) ten times, once for each of the ten five-bit R messages, CNU 300 implements a value-reuse technique, wherein CNU 300 (i) determines the Q messages with the smallest and second-smallest magnitudes using M1_M2 finder 302 and (ii) generates the ten five-bit R messages based on the smallest and second-smallest magnitudes.

During each of the first ten clock cycles, M1_M2 finder 302 receives a five-bit Q message in two's-complement format. The five-bit Q messages may be scaled and/or offset using scaling-and-offset logic block 310. Scaling and/or offsetting may be applied at various locations in CNU 300. For example, scaling and/or offsetting may be applied by scaling-and-offset logic block 334 or 346 in lieu of the scaling and/or offsetting performed by scaling-and-offset logic block 310. Alternatively, scaling and/or offsetting may be applied by two or more of scaling-and-offset logic block 310, 334, and 346. The scaling factors (e.g., $\alpha_1, \alpha_2, \alpha_3$) and/or offset values (e.g., $\beta_1, \beta_2, \beta_3$) may be provided by, for example, controller 214 of FIG. 2. When two or more of scaling-and-offset logic block 310, 334, and 346 are employed, the scaling factors and offset values may be different from one scaling-and-offset logic block to the next. As yet another alternative, scaling may be applied at a location different from offsetting. When scaling and offsetting are performed by different blocks in different locations, it may be said that the different blocks convert messages into scaled-and-offset messages based on a scaling factor and an offset value. For example, if block 310 performs scaling and block 346 performs offsetting, the blocks 310 and 346 may be said to convert the Q messages into scaled-and-offset R messages.

M1_M2 finder 302 converts each possibly-scaled and/or -offset Q message from two's-complement format to a five-bit sign-magnitude value using two's-complement-to-sign-magnitude (2TSM) converter 312. The sign bit 326 of the sign-magnitude value is provided to sign processing logic 328, which (i) generates a product of the sign bits 326 of all ten Q messages and (ii) multiplies each of the sign bits 326 by the product to generate a different sign bit 332 for each of 10 R messages. The four-bit magnitude |Q|[3:0] of the five-bit sign-magnitude value Q[4:0] is provided to multiplexer (MUX) 320 along with the four-bit minimum magnitude value M1 and the four-bit second minimum magnitude value M2 stored in partial state registers 330(0) and 330(1) of partial state memory 304, respectively. In addition, the four-bit magnitude value |Q|[3:0] is provided to flip-flop (FF) 314, which synchronizes the timing of CNU 300 with the clock signal of LDPC decoder 200.

Minimum operator 316(0) compares the magnitude value |Q| to minimum magnitude value M1 stored in register 330(0). If the magnitude value |Q| is smaller than minimum magnitude value M1, then minimum operator 316(0) asserts control signal 318(0) (i.e., sets 318(0) equal to 1). Otherwise, minimum operator 316(0) de-asserts control signal 318(0) (i.e., sets 318(0) equal to 0). Similarly, minimum operator 316(1) compares the magnitude value |Q| to second minimum magnitude value M2 stored in register 330(1). If the magnitude value |Q| is smaller than M2, then control signal 318(1) is asserted. Otherwise, control signal 318(1) is de-asserted. Note that, for purposes of this application, minimum magnitude value M1 and second minimum magnitude value M2 are considered to be messages. To further understand the operation of MUX 320, consider the logic table of Table I for magnitude value |Q|.

TABLE I

Multiplexer 320 Logic Table

| Control Signal 318(0) | Control Signal 318(1) | Output to 330(0) | Output to 330(1) |
|---|---|---|---|
| 0 (|Q| ≧ M1) | 0 (|Q| ≧ M2) | M1 | M2 |
| 0 (|Q| ≧ M1) | 1 (|Q| < M2) | M1 | |Q| |
| 1 (|Q| < M1) | 0 (|Q| ≧ M2) | N/A | N/A |
| 1 (|Q| < M1) | 1 (|Q| < M2) | |Q| | M1 |

Table I shows that, if control signals 318(0) and 318(1) are both de-asserted (i.e., |Q|≧M1 and M2), then magnitude value |Q| is discarded, and the previously stored minimum and second minimum magnitude values M1 and M2 are stored in M1 register 330(0) and M2 register 330(1), respectively. If control signal 318(0) is de-asserted and control signal 318(1) is asserted (i.e., M2≧|Q|≧M1), then (i) minimum magnitude value M1 is stored in M1 register 330(0), (ii) magnitude value |Q| is stored in M2 register 330(1), and (iii) previously stored second minimum magnitude value M2 is discarded. If control signals 318(0) and 318(1) are both asserted (i.e., |Q|<M1 and M2), then (i) magnitude value |Q| is stored in M1 register 330(0), (ii) the previously stored minimum value M1 is stored in M2 register 330(1), and (iii) the second minimum value M2 is discarded. In addition to storing magnitude value |Q| in M1 register 330(0), M1_index register 330(2) is enabled, counter value 324 (generated by counter 322) corresponding to the new minimum value M1 is stored in M1_index register 330(2), and the counter value previously stored in M1_index register 330(2) is discarded. Note that it is not possible that control signal 318(0) will be asserted and control signal 318(1) will be de-asserted because this would indicate that the magnitude value |Q| is smaller than minimum magnitude value M1 but larger than second minimum magnitude value M2. Also, before the first clock cycle, the minimum and second minimum magnitude values M1 and M2 are initialized to suitably large values (e.g., binary 1111), and M1_index is initialized to 0.

After all ten Q messages have been considered, the minimum magnitude value M1 and second minimum magnitude value M2 may be scaled and/or offset by scaling-and-offset logic block 334. Sign-magnitude-to-two's-complement (SMT2) converter 338 converts possibly-scaled and -offset four-bit minimum magnitude value M1' into a five-bit positive two's-complement value by appending a positive sign bit to four-bit value M1' and stores the five-bit result (+M1') in register 336(0) of final state processor 306. SMT2 converter 338 also converts the possibly-scaled and/or -offset four-bit offset minimum magnitude value M1' into a five-bit negative two's-complement value by appending a negative sign bit to four-bit value M1' and storing the five-bit result (−M1') in register 336(1). In addition, if sign bit 332 from sign processing logic 328 is a positive sign bit (0), then SMT2 converter 338 converts possibly-scaled and/or -offset four-bit second minimum magnitude value M2' into a five-bit positive two's-complement value (+M2') for storage in register 336(2). If sign bit 332 from sign processing logic 328 is a negative sign bit (1), then SMT2 converter 338 converts the possibly-scaled and/or -offset four-bit second minimum magnitude value M2' into a five-bit negative two's-complement value (−M2') for storage in register 336(2). Register 336(3) of final state processor 306 stores the counter value M1_INDEX from M1_index register 330(2).

During each of the next ten clock cycles, MUX 344 of R selector 308 outputs a five-bit R message based on (1) the positive value (+M1'), (2) the negative value (−M1'), (3) the positive or negative value (±M2'), (4) a comparison bit 342 from comparison operator 340, and (5) the corresponding sign bit 326 stored in sign processing logic 328. Each comparison bit 342 is generated by comparing current counter value 324 to the M1_index value stored in register 336(3). When the two are equal, comparison bit 342 is asserted, and when the two are not equal, comparison bit 342 is de-asserted. Each sign bit 332 may be generated as $\delta_{mn}^{(i)}$ using Equation (3), or alternatively, in the event that sign processing logic 328 is implemented using a FIFO, by multiplying a stored sign bit 326, as it is output from the FIFO, by the product of all sign bits 326 stored in sign processing logic 328. To further understand how R messages are output from MUX 344, consider the logic table of Table II.

TABLE II

Multiplexer 344 Logic Table

| Comparison Bit 342 | Sign Bit 332 | Output |
|---|---|---|
| 0 (A ≠ B) | 0 | +M1' |
| 0 (A ≠ B) | 1 | −M1' |
| 1 (A = B) | 0 | +M2' |
| 1 (A = B) | 1 | +M2' |

Table II shows that, if both comparison bit 342 and sign bit 332 are de-asserted, then the positive value (+M1') stored in register 336(0) will be output as the five-bit R message. If comparison bit 342 is de-asserted and sign bit 332 is asserted, then the negative value (−M1') stored in register 336(1) will be output as the five-bit R message. If comparison bit 342 is asserted and sign bit 332 is de-asserted, then the positive value (+M2') will have been stored in register 336(2) and will now be output as the five-bit R message. If both comparison bit 342 and sign bit 332 are asserted, then the negative value (−M2') will have been stored in register 336(3) and will now be output as the five-bit R message. The R messages may then be scaled and/or offset by scaling and offset logic 346.

Referring back to FIG. 2, cyclic shifters 212(0), ..., 212(3) receive sets of 72 five-bit R messages from their respective CNUs 210 and cyclically shift the sets of 72 five-bit R messages according to the cyclic shifts of the circulants $B_{j,k}$ of H-matrix 100 of FIG. 1. Essentially, cyclic shifters 212(0), ..., 212(3) reverse the cyclic shifting of cyclic shifters 208(0), ..., 208(3). For example, if cyclic shifters 208(0), ..., 208(3) perform cyclic upshifting, then cyclic shifters 212(0), ..., 212(3) may perform cyclic downshifting.

Cyclic shifters 212(0), ..., 212(3) provide 4×72 cyclically shifted five-bit R messages to VNUs 204(0), ..., 204(71), such that each VNU 204 receives four of the R messages, one from each cyclic shifter 212. Each VNU 204 updates each of the four five-bit Q messages that it generates as shown in Equation (4):

$$Q_{nm}^{(i)} = L_n^{(0)} + \sum_{m' \in M(n)/m} R_{m'n}^{(i-1)}, \qquad (4)$$

where m' is a check node in the set M(n)/m of all check nodes connected to the $n^{th}$ variable node except the $m^{th}$ check node (i.e., m'∈M(n)/m). The $n^{th}$ variable node generates message $Q_{nm}^{(i)}$ based on (i) all R messages received during the previous $(i-1)^{th}$ iteration from the set M(n)/m and (ii) an initial soft value $L_n^{(0)}$ received from soft value memory 202 that corresponds to the $n^{th}$ variable node. Each VNU 204, which may be implemented using adder circuits, outputs the four updated five-bit Q messages that it generates, such that a different one of the four messages is provided to a different corresponding MUX 206.

In addition to outputting four updated five-bit Q messages, each VNU 204 outputs (i) a seven-bit extrinsic LLR value, (ii) a hard-decision output bit, and (iii) an eight-bit P value. Each seven-bit extrinsic LLR value may be represented as shown in Equation (5):

$$\text{Extrinsic Value}_n = \sum_{m \in M(n)} R_{mn}^{(i)}, \qquad (5)$$

where m is a check node in the set M(n) of all check nodes connected to the $n^{th}$ variable node (i.e., m∈M(n)). Each eight-bit P value may be generated using Equation (6) as follows:

$$P_n = L_n^{(0)} + \sum_{m \in M(n)} R_{mn}^{(i)}, \text{ and} \qquad (6)$$

each hard-decision bit $\hat{x}_n$ may be generated based on Equations (7) and (8) below:

$$\hat{x}_n = 0 \text{ if } P_n \geq 0 \qquad (7)$$

$$\hat{x}_n = 1 \text{ if } P_n < 0 \qquad (8)$$

$P_n$ is determined for each variable node by adding the extrinsic value from Equation (5) to the initial soft value $L_n^{(0)}$ received from soft-value memory 202 that corresponds to the $n^{th}$ variable node. If $P_n$ is greater than or equal to zero, then the hard-decision bit $\hat{x}_n$ is equal to zero, as shown in Equation (7). If $P_n$ is less than zero, then the hard-decision bit $\hat{x}_n$ is equal to one, as shown in Equation (8).

A parity check is then performed by, for example, controller 214, using the hard-decision values to determine whether LDPC decoder 200 has converged on a valid codeword. In particular, a 720-element vector $\hat{x}$ formed from 720 hard-decision bits $\hat{x}_n$ output from VNUs 204(0), ..., 204(71) during ten clock cycles is multiplied by the transpose $H^T$ of H-matrix 100 of FIG. 1 to generate a 288-bit vector, where each bit of the 288-bit vector corresponds to one of the 288 check nodes (i.e., rows) of H-matrix 100. If each element of the resulting 288-bit vector is equal to zero (i.e., $\hat{x}H^T=0$), then LDPC decoder 200 has converged on a valid codeword. If, on the other hand, one or more elements of the resulting 288-bit vector is equal to one (i.e., $\hat{x}H^T\neq 0$), then LDPC decoder 200 has not converged on a valid codeword. Each element of the 288-bit vector that has a value of one is considered an unsatisfied check node. If and when LDPC decoder 200 converges on a valid codeword, a cyclic-redundancy check (CRC) may be performed by, for example, controller 214. If the CRC is successful, then LDPC decoder 200 has converged on a valid correct codeword. If the CRC is unsuccessful, then LDPC decoder 200 has converged on a valid but incorrect codeword.

If LDPC decoder 200 does not converge on a valid codeword or converges on a valid but incorrect codeword, then further action is needed to properly recover the correct codeword. For example, subsequent local iterations of LDPC decoder 200 may be performed to converge on a valid correct codeword. As another example, a global iteration may be performed, whereby (i) the extrinsic LLR values are fed back to the upstream processor, (ii) the detector generates a new set of 720 five-bit soft values $L_n^{(0)}$, and (iii) LDPC decoder 200 attempts to recover the correct codeword from the new set of 720 five-bit soft values $L_n^{(0)}$. If LDPC decoder 200 does not converge on a valid correct codeword within a predefined number of local and/or global iterations, then the receiver and/or LDPC decoder may take further action to recover a valid codeword, such as perform other methods designed to break trapping sets. In some cases, LDPC decoder 200 might not be capable of recovering the correct codeword. As yet another example, the receiver in which LDPC decoder 200 resides may request a retransmission of the data.

For each subsequent attempt to decode the codeword (e.g., each subsequent local iteration, subsequent global iteration, or retransmission), controller 214 may select one or more different scaling factors $\alpha$, one or more different offset values $\beta$, or both one or more different scaling factors $\alpha$ and one or more different offset values $\beta$. The scaling factors $\alpha$ and offset values $\beta$ may be selected using any suitable method. For example, the scaling factors $\alpha$ and offset values $\beta$ may be selected based on the number of unsatisfied check nodes identified during the parity check. When the number of unsatisfied check nodes is relatively small, scaling factors $\alpha$ relatively close to one and offset values $\beta$ relatively close to zero may be selected to induce relatively small changes in the check-node messages. When the number of unsatisfied check nodes is relatively large, smaller scaling factors $\alpha$ and/or larger offset values $\beta$ may be selected to induce relatively large changes in the check-node messages. As a scaling factor $\alpha$ decreases from one, and as an offset value $\beta$ increases from zero, changes to the check-node messages increase.

As another example, the scaling factors $\alpha$ and offset values $\beta$ may be incremented after a predetermined number of iterations. The scaling factors $\alpha$ may be adjusted, for example, by increments of 0.2, and the offset values $\beta$ may be adjusted by, for example, increments of 1.

By changing the scaling factor $\alpha$ and/or offset value $\beta$, LDPC decoders of the present invention may be capable of improving error-floor characteristics over LDPC decoders that implement only fixed or no scaling or fixed or no offsetting factors. When an LDPC decoder of the present invention is confronted with a trapping set, the decoder may change one or more scaling factors $\alpha$ and/or one or more offset values $\beta$ to attempt to break the trapping set, such that the LDPC decoder has another opportunity to correctly decode the codeword.

Although the present invention has been described relative to the specific non-layered LDPC decoder configuration 200 of FIG. 2, the present invention is not so limited. Various embodiments of the present invention may also be envisioned for other LDPC decoder structures that employ message passing. For example, the present invention may be implemented for other non-layered or for layered decoder structures, and decoders that use message-passing schedules other than a block-serial message-passing schedule. As another example, LDPC decoders of the present invention may be implemented without using cyclic shifters. In such embodiments, the messages may be passed between CNUs and VNUs through direct connections or using permutators that perform non-cyclic shifting.

According to various embodiments, the present invention may be implemented using check-node algorithms other than the min-sum algorithm. In such embodiments, scaling and/or offsetting may be applied to check-node messages and/or variable-node messages, in a manner similar to that of scaling-and-offset logic block 346 and 310, respectively. Further, scaling and/or offsetting may be applied by the check-node algorithm before the check-node messages are generated, similar to that of scaling-and-offset logic block 334.

Although the present invention was described relative to the specific H-matrix 100 of FIG. 1, the present invention is not so limited. The present invention may be implemented for various H-matrices that are the same size as or a different size from matrix 100 of FIG. 1. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 100. Such H-matrices may be, for example, cyclic, quasi-cyclic, non-cyclic, regular, or irregular H-matrices. Further, such H-matrices may comprise sub-matrices other than circulants including zero matrices. Note that the number of VNUs, barrel shifters, and/or CNUs may vary according to the characteristics of the H-matrix.

It will be further understood that various changes in the details, materials, and arrangements of the parts which have been described and illustrated in order to explain the nature of this invention may be made by those skilled in the art without departing from the scope of the invention as expressed in the following claims. For example, the scaling-and-offset logic block may be implemented in locations other than the three locations shown in FIG. 3 (e.g., other than 310, 334, 346), such as at the magnitude |Q| input of multiplexer 320 or between SMT2 converter 338 and final state registers 336(0), . . . , 336(2). Scaling-and-offset logic block 310 may also be located at the output of a VNU (or adder that generates variable-node messages), rather than as part of CNU 300, and scaling-and-offset logic block 346 may also be located at the input of a VNU (or adder that generates variable-node messages), rather than as part of CNU 300. As another example, rather than receiving Q messages and outputting R messages using two's-complement format, CNU 300 may receive and output messages in another format such as sign-magnitude format. Also, two's-complement-to-sign-magnitude conversion may be performed by, for example, the VNUs. As yet another example, LDPC decoders of the present invention may process messages of sizes other than five bits.

Although embodiments of the present invention have been described in the context of LDPC codes, the present invention is not so limited. Embodiments of the present invention could be implemented for any code that can be defined by a graph, e.g., tornado codes and structured IRA codes, since graph-defined codes suffer from trapping sets.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention is also not limited to receiving and processing log-likelihood ratios. Various embodiments of the present invention may be envisioned in which other soft values, such as likelihood ratios, or hard bit decisions are processed.

The term "increment" as used in the specification and the claims shall be understood to include instances when a value is increased and instances when the value is decreased. For example, incrementing the scaling factor by a specified scaling-factor increment includes instances when the scaling factor is increased by the specified scaling-factor increment and instances when the scaling factor is decreased the by the specified scaling-factor increment.

As used in the specification and the claims, a second value may be said to be generated "based on" a first value even though intermediate values are generated between the first and second values. For example, variable-node messages may be said to be generated "based on" soft values $L_n^{(0)}$ received by the decoder even though check-node messages are generated between receipt of the soft values $L_n^{(0)}$ and generation of the check-node messages. As another example, check-node messages generated during a second local iteration of the LDPC decoder may be said to be "based on" soft values $L_n^{(0)}$ received during the first local iteration even though variable-node messages and other check-node messages are generated between receipt of the soft values $L_n^{(0)}$ and generation of the check-node messages for the second local iteration.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

I claim:

1. An apparatus comprising an error-correction decoder for decoding an error-correction-encoded codeword to recover a correct codeword, wherein:
   the decoder is configured to generate a first set of messages based on an initial set of initial values generated by an upstream processor, wherein:
      the initial set corresponds to the error-correction-encoded codeword; and
      each initial value in the initial set corresponds to a different bit of the error-correction-encoded codeword; and
   the decoder comprises:
      one or more blocks configured to convert the first set of messages into scaled-and-offset messages based on a scaling factor and an offset value; and
      a controller configured to select the scaling factor and the offset value.

2. The apparatus of claim 1, wherein:
   the error-correction decoder comprises a variable-node unit configured to generate variable-node messages;
   the first set of messages are the variable-node messages; and
   the one or more blocks are configured to convert the variable-node messages into scaled-and-offset variable-node messages based on the scaling factor and the offset value.

3. The apparatus of claim 1, wherein:
   the error-correction decoder comprises a check-node unit configured to generate check-node messages;
   the first set of messages are the check-node messages; and
   the one or more blocks are configured to convert the check-node messages into scaled-and-offset check-node messages based on the scaling factor and the offset value.

4. The apparatus of claim 1, wherein:
   the error-correction decoder implements a min-sum algorithm;
   the error-correction decoder comprises a check-node unit configured to generate first-minimum and second-minimum magnitude values of the min-sum algorithm;
   the first set of messages are the first-minimum and second-minimum magnitude values; and the one or more blocks are configured to convert the first-minimum and second-minimum magnitude values into scaled-and-offset first-minimum and second-minimum magnitude values based on the scaling factor and the offset value.

5. The apparatus of claim 1, wherein:
the controller is capable of setting the scaling factor to 1; and
the controller is capable of setting the offset value to 0.

6. The apparatus of claim 1, wherein the one or more blocks comprise a scaling-and-offset block that performs both scaling and offsetting.

7. The apparatus of claim 1, wherein:
the decoder is a low-density parity-check decoder; and
the values received from the upstream processor are soft-output values having a hard-decision bit and one or more confidence-value bits.

8. The apparatus of claim 1, wherein the controller is configured to (i) select an initial scaling factor and an initial offset value and (ii) subsequently modify at least one of the initial scaling factor and the initial offset value.

9. The apparatus of claim 8, wherein the controller modifies the at least one of the initial scaling factor and the initial offset value after the controller determines that the error-correction decoder does not converge on the correct codeword within a predetermined number of decoding iterations.

10. The apparatus of claim 8, wherein the controller is configured to modify both the initial scaling factor and the initial offset value.

11. The apparatus of claim 8, wherein the controller is configured to modify the initial scaling factor by incrementing the initial scaling factor by a specified scaling-factor increment.

12. The apparatus of claim 8, wherein the controller is configured to modify the initial offset value by incrementing the initial offset value by a specified offset-value increment.

13. A method for decoding an error-correction encoded codeword to recover a correct codeword, the method comprising:
(a) selecting a scaling factor and an offset value;
(b) receiving an initial set of initial values from an upstream processor, wherein:
the initial set corresponds to the error-correction-encoded codeword; and
each initial value in the initial set corresponds to a different bit of the error-correction-encoded codeword;
(c) generating a first set of messages based on the initial set of initial values; and
(d) converting the first set of messages into scaled-and-offset messages based on the scaling factor and the offset value.

14. The method of claim 13, wherein:
step (c) comprises generating variable-node messages as the first set of messages; and
step (d) comprises converting the variable-node messages into scaled-and-offset variable-node messages based on the scaling factor and the offset value.

15. The method of claim 13, wherein:
step (c) comprises generating check-node messages as the first set of messages; and
step (d) comprises converting the check-node messages into scaled-and-offset check-node messages based on the scaling factor and the offset value.

16. The method of claim 13, wherein:
step (c) comprises generating first-minimum and second-minimum magnitude values of a min-sum algorithm as the first set of messages; and
step (d) comprises converting the first-minimum and second-minimum magnitude values into scaled-and-offset first-minimum and second-minimum magnitude values based on the scaling factor and the offset value.

17. The method of claim 13, wherein:
step (a) comprises selecting an initial scaling factor and an initial offset value;
step (d) comprises converting the first set of messages into scaled-and-offset messages based on the initial scaling factor and the initial offset value; and
the method further comprises:
(e) subsequently modifying at least one of the initial scaling factor and the initial offset value;
(f) generating a second set of messages; and
(g) converting the second set of messages into scaled-and-offset messages based on the initial scaling factor and the initial offset value as modified in step (e).

18. The method of claim 17, wherein the at least one of the initial scaling factor and the initial offset value is modified after determining that the method does not converge on the correct codeword within a predetermined number of decoding iterations.

19. The method of claim 13, wherein:
the error-correction-encoded codeword is a low-density parity-check encoded codeword; and
the values received from the upstream processor are soft-output values having a hard-decision bit and one or more confidence-value bits.

20. An apparatus for decoding an error-correction encoded codeword to recover a correct codeword, the apparatus comprising:
(a) means for selecting a scaling factor and an offset value;
(b) means for receiving an initial set of initial values from an upstream processor, wherein:
the initial set corresponds to the error-correction-encoded codeword; and
each initial value in the initial set corresponds to a different bit of the error-correction-encoded codeword;
(c) means for generating a first set of messages based on the initial set of initial values; and
(d) means for converting the first set of messages into scaled-and-offset messages based on the scaling factor and the offset value.

* * * * *